(12) United States Patent
Hashimoto et al.

(10) Patent No.: US 6,534,704 B2
(45) Date of Patent: Mar. 18, 2003

(54) SOLAR CELL

(75) Inventors: Yasuhiro Hashimoto, Kyoto (JP); Takayuki Negami, Osaka (JP); Shigeo Hayashi, Kyoto (JP); Takuya Satoh, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/972,123

(22) Filed: Oct. 5, 2001

(65) Prior Publication Data
US 2002/0043278 A1 Apr. 18, 2002

(30) Foreign Application Priority Data
Oct. 18, 2000 (JP) .................................... 2000-317970

(51) Int. Cl.[7] ............................................. H01L 31/072
(52) U.S. Cl. ..................... 136/265; 136/252; 136/260; 136/262; 136/264; 257/43; 257/428; 257/461; 257/464
(58) Field of Search ............................... 136/252, 255, 136/260, 262, 264, 265; 257/43, 428, 461, 464

(56) References Cited

U.S. PATENT DOCUMENTS

| 3,978,510 A | 8/1976 | Kasper et al. |
| 4,016,586 A | 4/1977 | Anderson et al. |
| 4,024,558 A * | 5/1977 | Merrin ..................... 136/258 |

(List continued on next page.)

FOREIGN PATENT DOCUMENTS

| EP | 863555 | 9/1998 |
| JP | 1-28967 | 1/1989 |
| JP | 3-64973 | 3/1991 |
| JP | 4-132233 | 5/1992 |
| JP | 5-63224 | 3/1993 |
| JP | 6-45248 | 2/1994 |
| JP | 8-195501 | 7/1996 |
| JP | 8-330614 | 12/1996 |
| JP | 9-199741 | 7/1997 |
| JP | 2000-323733 | 11/2000 |
| WO | WO 94/07269 | 3/1994 |

OTHER PUBLICATIONS

A.G. Fitzgerald et al. "A microbeam analysis study of heterojunctions formed with $CuInS_2$ and $CuInSe_2$" Solar Energy Materials, vol. 22, pp. 43–61.

Niemegeers et al. "Model for Electronic Transport in Cu(In, Ga)$Se_2$ Solar Cells", Progress in Photovalics, 6, 407–421 (1998).

Schmid et al. "Solar Energy Materials and Solar Cells", 41/42, 281–294 (1996).

Negami et al. "CIGS Solar Cells Using a Novel Window $Zn_{1-x}Mg_xO$ Film", Proc. 28th IEEE Photovalic Specialists Conf., Anchorage, Alaska, Sep. 2000, to be published.

(List continued on next page.)

*Primary Examiner*—Nam Nguyen
*Assistant Examiner*—Brian L Mutschler
(74) *Attorney, Agent, or Firm*—Merchant & Gould P.C.

(57) ABSTRACT

A solar cell includes a first semiconductor layer that is p-type, and a second semiconductor layer that is n-type formed over the first semiconductor layer. The solar cell includes a layer A made of a semiconductor different from the first semiconductor layer and the second semiconductor layer or an insulator between the first semiconductor layer and the second semiconductor layer. The band gap $Eg_1$ of the first semiconductor layer and the band gap $Eg_2$ of the second semiconductor layer satisfy the relationship $Eg_1 < Eg_2$. The electron affinity $\chi_1$ (eV) of the first semiconductor layer and the electron affinity $\chi_2$ (eV) of the second semiconductor layer satisfy the relationship $0 \leq (\chi_1 - \chi_2) < 0.5$, and the average layer thickness of the layer A is 1 nm or more and 20 nm or less.

20 Claims, 5 Drawing Sheets

U.S. PATENT DOCUMENTS

| | | | |
|---|---|---|---|
| 4,106,951 A | | 8/1978 | Masi |
| 4,335,266 A | | 6/1982 | Mickelsen et al. |
| 4,398,054 A | * | 8/1983 | Madan .................. 136/255 |
| 4,612,411 A | | 9/1986 | Weiting et al. |
| 4,687,881 A | | 8/1987 | Goslowsky et al. |
| 5,078,804 A | | 1/1992 | Chen et al. |
| 5,112,410 A | | 5/1992 | Chen |
| 5,137,835 A | | 8/1992 | Karg |
| 5,141,564 A | | 8/1992 | Chen et al. |
| 5,356,839 A | | 10/1994 | Tuttle et al. |
| 5,422,304 A | | 6/1995 | Kohiki et al. |
| 5,441,897 A | | 8/1995 | Noufi et al. |
| 5,474,939 A | | 12/1995 | Pollack et al. |
| 5,578,503 A | | 11/1996 | Karg et al. |
| 5,626,688 A | | 5/1997 | Probst et al. |
| 5,843,341 A | | 12/1998 | Orita et al. |
| 5,858,121 A | | 1/1999 | Wada et al. |
| 5,948,176 A | | 9/1999 | Ramanathan et al. |
| 5,981,868 A | | 11/1999 | Kushiya et al. |
| 6,259,016 B1 | | 7/2001 | Negami et al. |

OTHER PUBLICATIONS

"Prospects of wide–gap chalcopyrites for thin film photovoltaic modules" by R. Herberholz et al., Solar Energy Materials and Solar Cells, vol. 49, No. 3, pp 227–237, 1997.

"Optimization of CdS Layers in High Efficiency Cu(In, Ga)Se2 Based Solar Cells", Symposium P, E–MRS 2001 Spring Meeting Abstract, Jun. 5–8, 2001.

Kurita et al, Proceedings of the 1st Photovoltaic Science and Engineering Conference in Japan, 1979; Japanese Journal of Applied Physics, vol. 19 (1980) Supplement, 19–2, pp. 169–172.

Aranovich et al, J. Appl. Phys., 51(8) pp. 4260–4268, Aug. 1980.

Potter et al, "Device Analysis of CIunSe2/(Cd,Zn)S/ZnO Solar Cells," Conference Record, 18th IEEE Photovoltaic Specialists Conference, pp. 1659–1664, published Apr. 1986.

Devi et al, "Photodielectric Studies in (MgO–ZnO) Mixed System," Nat. Acad. Sci. Letters, 14(11), pp. 453–457, 1991.

* cited by examiner

SOLAR CELL

BACKGROUND OF THE INVENTION

1. Field of the Invention

The present invention relates to solar cells.

2. Description of the Prior Art

CuInSe$_2$ (which may be referred to as CIS in the following) and Cu(In, Ga)Se$_2$ (which may be referred to as CIGS in the following), which is obtained by substituting a part of In of the CIS with Ga, are known as compound semiconductors (of chalcopyrite structure) comprising at least one element from each of groups Ib, IIIb and VIb. Conventionally, thin-film solar cells using these semiconductors as the light-absorption layer have been under research. These thin-film solar cells have a high energy conversion efficiency, which does not deteriorate due to exposure to light or the like. Therefore, such a thin film solar cell has received attention.

In the solar cell using CIS or CIGS as the light-absorption layer, the solar cell can have high efficiency by using a window layer made of CdS. This is because the conduction band offset between CdS and CIS (or CIGS) is suitable for production of high efficiency solar cells. Therefore, in order to obtain high efficiency solar cells, it is preferable to use a semiconductor having a band structure similar to that of CdS and CIS (or CIGS) for the window layer.

However, when forming the window layer using a semiconductor having a band structure similar to that of CdS, the semiconductor layer serving as the light-absorption layer is damaged so that the efficiency is reduced.

SUMMARY OF THE INVENTION

Therefore, with the foregoing in mind, it is an object of the present invention to provide a solar cell having a band structure that can achieve a high conversion efficiency with reduced damage to the semiconductor layer serving as the light-absorption layer.

A solar cell of the present invention includes a first semiconductor layer that is p-type, and a second semiconductor layer that is n-type formed over the first semiconductor layer. The solar cell includes a layer A made of an insulator or a semiconductor different from the first semiconductor layer and the second semiconductor layer between the first semiconductor layer and the second semiconductor layer. The band gap Eg$_1$ of the first semiconductor layer and the band gap Eg$_2$ of the second semiconductor layer satisfy the relationship Eg$_1$<Eg$_2$. The electron affinity $\chi_1$ (eV) of the first semiconductor layer and the electron affinity $\chi_2$ (eV) of the second semiconductor layer satisfy the relationship $0\leq(\chi_1-\chi_2)<0.5$. The average layer thickness of the layer A is 1 nm or more and 20 nm or less. This solar cell has a band structure that can provide a high conversion efficiency. Furthermore, since the solar cell is provided with the layer A, the first semiconductor layer serving as the light-absorption layer can be prevented from being damaged when forming the second semiconductor layer. Therefore, with this solar cell, a high efficiency solar cell can be achieved.

In the above solar cell, the second semiconductor layer may be formed by sputtering. This embodiment allows the second semiconductor layer having various compositions to be formed.

In the above solar cell, the second semiconductor layer may be formed of an oxide containing Zn and Mg. This embodiment facilitates formation of a band structure that can provide a high efficiency. In this embodiment, in particular, it is preferable that the oxide is represented by a general formula Zn$_{1-x}$Mg$_x$O, where 0<X<0.5.

In the above solar cell, the layer A may include Cd and S as main components (constituent elements) or may include Zn, O and S as main components (constituent elements). This embodiment provides a satisfactory junction. In this embodiment, it is preferable that the layer A is formed from a solution containing a salt of Cd or Zn and a sulfur-containing compound. This embodiment allows the layer A to be formed without causing damage to the first semiconductor layer.

In the above solar cell, the layer A may be formed of a compound containing Se and at least one element selected from Zn and In. This embodiment provides a satisfactory junction.

In the above solar cell, it is preferable that the first semiconductor layer includes at least one element from each of groups Ib, IIIb and VIb (constitution 1). In the case of this constitution, it is preferable that the element from group Ib is Cu, the element from group IIIb is at least one element selected from In and Ga, and the element from group VIb is at least one element selected from Se and S. This embodiment provides a solar cell having a particularly high efficiency. Throughout this specification, "groups Ib, IIIb, and VIb" refer to "groups 1B, 3B, and 6B" of the periodic table of elements according to the old IUPAC recommendation before 1985.

In the case of the constitution 1, it is preferable that the solar cell further includes a third semiconductor layer disposed between the first semiconductor layer and the layer A. It is preferable that the third semiconductor layer includes an element from group Ib, an element from group IIIb and sulfur, and an atomic ratio of sulfur in the third semiconductor layer is higher than that in the first semiconductor layer. This embodiment provides a satisfactory junction.

In the case of the constitution 1, it is preferable that the first semiconductor layer comprises at least one element selected from Cd and Zn on the surface thereof on the side of the layer A. This embodiment provides a satisfactory junction.

These and other advantages of the present invention will become apparent to those skilled in the art upon reading and understanding the following detailed description with reference to the accompanying figures.

DESCRIPTION OF THE PREFERRED EMBODIMENTS

Figure 1:
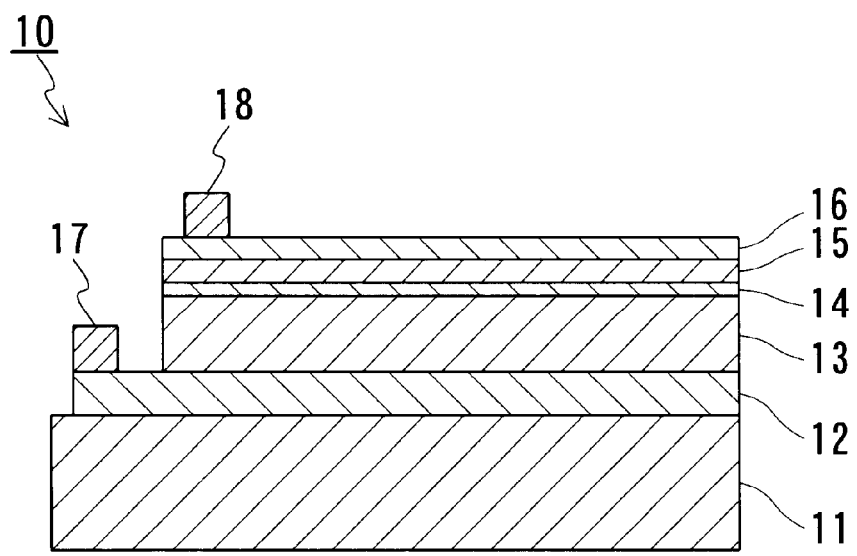
FIG. 1 is a cross-sectional view showing an example of the solar cell of the present invention.

Hereinafter, the present invention will be described with reference to the accompanying drawings. FIG. 1 is a cross-sectional view of a solar cell 10 as an example of the solar cell of the present invention.

Referring to FIG. 1, the solar cell 10 includes a substrate 11, a lower electrode layer 12, a first semiconductor layer 13, a layer 14 (layer A), a second semiconductor layer 15, and an upper electrode layer 16, which are formed sequentially on the substrate 11 in this order, and interconnection electrodes 17 and 18 that are formed on the lower electrode layer 12 and the upper electrode layer 16, respectively.

For the substrate 11, for example, glass, stainless steel, or a polyimide film can be used.

The lower electrode film 12 is made of a conductive material, for example, a metal such as Mo.

The first semiconductor layer 13 is a p-type semiconductor and serves as a light-absorption layer. The first semiconductor layer 13 is provided closer to the back surface than the second semiconductor layer 15 is. For the first semiconductor layer 13, for example, a compound semiconductor layer comprising at least one element from each of groups Ib, IIIb, and VIb can be used. Specifically, Cu can be used as the element from group Ib, at least one selected from In and Ga can be used as the element from group IIIb, and at least one selected from Se and S can be used as the element from group VIb. More specifically, as the first semiconductor layer 13, for example, $CuInSe_2$, $Cu(In, Ga)Se_2$, $CuInS_2$, $Cu(In, Ga)S_2$, $CuIn(S, Se)_2$ or $Cu(In, Ga)(S, Se)_2$ can be used. Furthermore, it is preferable that the first semiconductor layer 13 contains at least one element selected from Cd and Zn on the surface thereof on the side of the layer 14.

Figure 2:
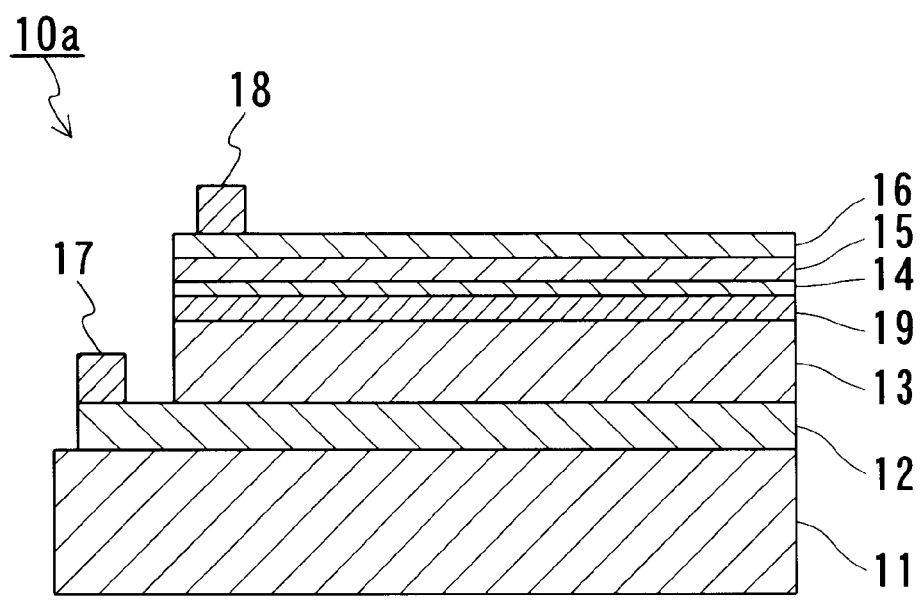
FIG. 2 is a cross-sectional view showing another example of the solar cell of the present invention.

The solar cell of the present invention further can contain a third semiconductor layer between the first semiconductor layer 13 and the layer 14. FIG. 2 is a cross-sectional view of a solar cell 10a further including the third semiconductor layer 19. The third semiconductor layer 19 contains an element from group Ib, an element from group IIIb and sulfur. The sulfur content rate (atomic %) in the third semiconductor layer 19 is higher than that in the first semiconductor layer 13. More specifically, $CuIn(Se, S)_2$ or $Cu(In, Ga)(Se, S)_2$ can be used as the third semiconductor layer 19.

The layer 14 (layer A) is disposed between the first semiconductor layer 13 and the second semiconductor layer 15. The layer 14 is made of an insulator or a semiconductor different from the first semiconductor layer 13 and the second semiconductor layer 15. The average layer thickness of the layer 14 is 1 nm or more and 20 nm or less, preferably 7 nm or more and 13 nm or less. Moreover, it is preferable that the thickness of the layer 14 is 1 nm or more and 20 nm or less, preferably 7 nm or more and 13 nm or less, in any portion of the layer.

The layer 14 may contain Cd and S as the main components. For example, a layer made of CdS can be used for the layer 14. The layer 14 may contain Zn, O and S as the main components. For example, a layer made of Zn(O, S) can be used for the layer 14. Alternatively, an oxide containing Zn and an element from group IIIb (e.g., In) or a chalcogenide containing Zn and an element from group IIIb can be used for the layer 14. Furthermore, a layer made of a compound containing Se and at least one element selected from Zn and In can be used for the layer 14. For example, a layer made of $ZnIn_2Se_4$ can be used. A layer made of $In_2Se_3$ or a layer made of ZnSe also can be used.

The layer 14 can be formed, for example, by vapor deposition or a chemical bath deposition process. For example, for the layer 14 containing metal and sulfur as constituent elements, the substrate 11 provided with the first semiconductor layer 13 is immersed in a solution containing a salt of the metal and a sulfur-containing compound to form the layer 14.

The second semiconductor layer 15 is an n-type semiconductor layer. The second semiconductor layer 15 is disposed over the first semiconductor layer 13, that is, on the light incident side. The band gap $Eg_1$ (eV) of the first semiconductor layer 13 and the band gap $Eg_2$ (eV) of the second semiconductor layer 15 satisfy the relationship $Eg_1 < Eg_2$. The band gap of the first semiconductor layer 13 is, for example, 1.2 eV to 1.5 eV, preferably 1.4 eV to 1.5 eV.

Figure 3:
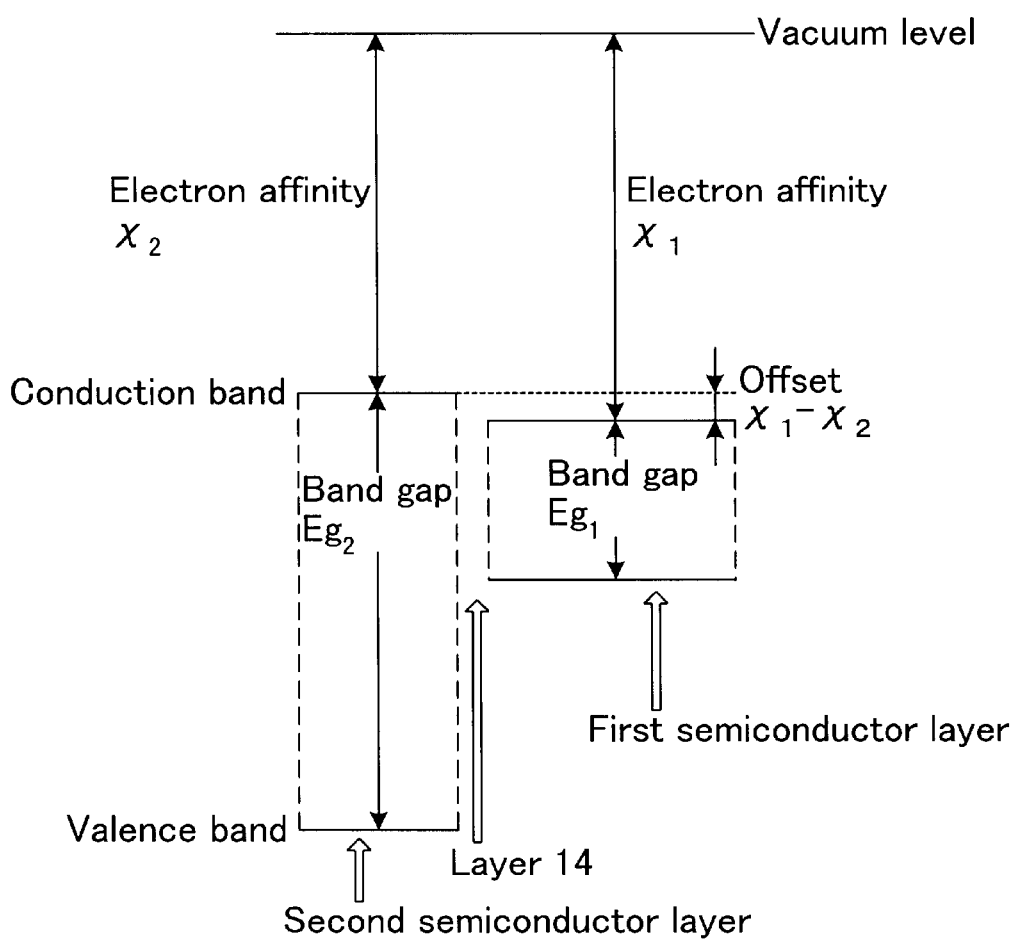
FIG. 3 is a schematic diagram showing the band structure of a part of the solar cell of the present invention.

The electron affinity $\chi$(eV) of the first semiconductor layer 13 and the electron affinity $\chi_2$ (eV) of the second semiconductor layer 15 satisfy the relationship $0 \leq (\chi_1 - \chi_2) < 0.5$ (preferably $0 < (\chi_1 - \chi_2) < 0.4$). FIG. 3 schematically shows the band structure of the first semiconductor layer 13 and the second semiconductor layer 15. In the FIG. 3, the band of the layer 14 is omitted.

An example of the combination of the first semiconductor layer 13 and the second semiconductor layer 15 is as follows. The first semiconductor layer 13 is the CIS layer or the CIGS layer, and the second semiconductor layer 15 is made of an oxide containing Zn and Mg. More specifically, as the second semiconductor layer 15, a layer made of an oxide expressed by $Zn_{1-x}Mg_xO$ (where $0 < X < 0.5$, preferably $0.1 < X < 0.5$) can be used. Such an oxide can be formed by, for example, sputtering. In the solar cell 10, even if the second semiconductor layer 15 is formed by sputtering, the layer 14 can prevent the first semiconductor layer 13 from being damaged.

For the upper electrode layer 16, a transparent conductive film can be used, and for example, ZnO:Al where ZnO is doped with Al, or ITO (indium tin oxide) can be used.

For the interconnection electrodes 17 and 18, metal films can be used. For example, metal films comprising a laminate of a NiCr film and an Au film can be used.

Next, the functions of the solar cell 10 will be described by taking as an example a solar cell using a CIGS layer for the first semiconductor layer 13, which is the light-absorption layer.

Figure 4A:
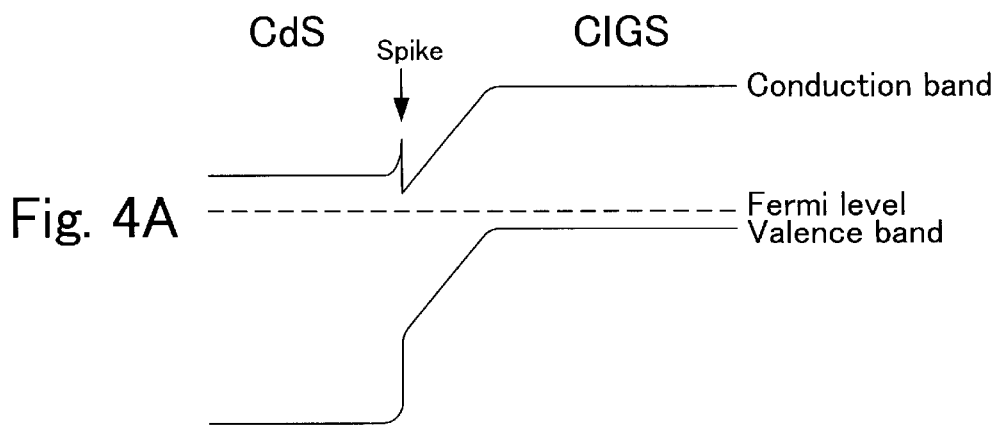
FIG. 4A is an example of the simulation results of the band structure of the solar cell.
Figure 4B:
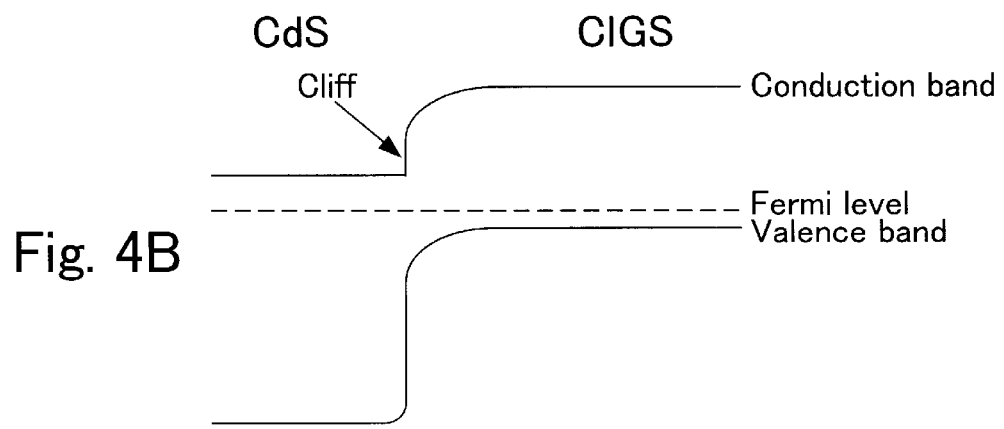
FIG. 4B is another example of the simulation results of the band structure of the solar cell.

In order to improve the efficiency of the solar cell using a light-absorption layer made of CIGS, it is effective to enlarge the band gap of the CIGS layer. However, in a conventional solar cell provided with a window layer made of CdS, when the band gap of the CIGS layer is broadened to 1.3 eV or more, contrary to the theory, the efficiency is reduced. This may be caused partly by the energy difference (offset) in the conduction band at the heterojunction between the CIGS layer as the light-absorption layer and the CdS layer as the window layer. E. Herberholz et al. has put forward one model regarding the junction between CdS and CIGS (Solar Energy Materials and Solar Cells, p.227, vol.49, no. 3, published in 1997). In this model, in the case where the ratio {Ga/(In+Ga)} by number of atoms in the CIGS layer is lower than 0.5, the band discontinuity caused by the offset of the conduction band between the CdS layer and the CIGS layer is in a spike-like form, where the conduction band of the CdS layer is raised and is projected in the vicinity of the junction. In the case where the ratio {Ga/(In+Ga)} by number of atoms is higher than 0.5, the band discontinuity is in a cliff-like form, where the conduction band of the CIGS layer is raised, and a step (leap) is generated between the conduction band of the CdS layer and the conduction band of CIGS layer. FIG. 4A is the band diagram when the offset between CdS and CIGS is spike-like, and FIG. 4B is the band diagram when the offset between CdS and CIGS is cliff-like. This model suggests that when the band discontinuity of the conduction band is cliff-like, recombination increases at the heterojunction interface and in the vicinity of the interface, so that the conversion efficiency is reduced. Similarly to this phenomenon, in the case where the band gap of the CIGS layer is 1.2 eV–1.3 eV, it is expected that when the CdS layer as the window layer is replaced by a ZnO layer, the band discontinuity of the conduction bands of the ZnO layer and the CIGS layer is cliff-like where the conduction band of the CIGS layer is raised.

Such a band discontinuity of the conduction band of the heterojunction results from the difference in the electron affinity between the window layer and the CIGS film as the light-absorption layer. In general, with respect to an n-type semiconductor and p-type semiconductor having different band gaps, in the case of $\chi_n < \chi_p$, where $\chi_n$ is the electron affinity of the n-type semiconductor and $\chi_p$ is the electron affinity of the p-type semiconductor, the discontinuity of the conduction bands is spike-like. On the other hand, in the case of $\chi_n > \chi_p$, the discontinuity of the conduction bands is cliff-like. When the electron affinity is compared between a CuInSe$_2$ layer free from Ga and the CdS layer, the electron affinity of the CdS layer is smaller by about 0.2 eV to 0.3 eV. Therefore, when a heterojunction is formed with these semiconductor layers, a spike is generated on the side of CdS. However, the electron affinity of CIGS decreases with increasing Ga concentration in the CIGS layer. Consequently, when the Ga concentration exceeds a certain level, the electron affinity of CIGS becomes smaller than that of CdS, so that, when a heterojunction is formed with these semiconductor layers, a cliff is generated on the side of CIGS.

Furthermore, the form of the band discontinuity of the window layer and the CIGS layer also is determined by the electron affinities of the window layer and the CIGS layer. When the CdS layer and the ZnO layer for the window layer are compared, since the electron affinity of ZnO is about 0.4 eV larger than that of CdS, a cliff is generated when a heterojunction is formed even with a CuInSe$_2$ layer free from Ga, which may reduce the conversion efficiency.

In the case where the electron affinity of the window layer is smaller than that of the light-absorption layer so that a spike is generated in the conduction band, the energy difference in the conduction bands is large so that it affects the conversion efficiency of the solar cell. The energy difference between CdS and CIGS is about 0.2 eV to 0.3 eV, which does not substantially form a barrier against carrier transport. On the other hand, for example, when ZnS is used as the window layer, the energy difference between ZnS and the CIGS is about 1.6 eV, which forms a barrier for photo-excited carriers. In this case, carrier transport is prevented, so that photocurrent is not substantially accessible from the outside. Therefore, the conversion efficiency is reduced. Thus, when a spike is generated in the conduction bands of the window layer and the light-absorption layer, there is an optimal range of the energy difference (offset) in the conduction band that can provide a high conversion efficiency. In view of the above-described optimal ranges, the electron affinities and the band gaps of the first semiconductor layer 13 (light-absorption layer) and the second semiconductor layer 15 (window layer) are defined for the solar cell 10 (see JP 2000-323733A, U.S. Pat. No. 6,259,016). Although the layer 14 is interposed between the first semiconductor layer 13 and the second semiconductor layer 15, the layer 14 is so thin that it hardly affects the optimal range.

As described above, according to the solar cell 10 of this embodiment, a solar cell that can achieve a high efficiency can be obtained. Furthermore, since the solar cell 10 includes the layer 14, the first semiconductor layer 13 can be prevented from being damaged when forming the second semiconductor layer 15. In particular, even if the second semiconductor layer 15 is formed by sputtering, the first semiconductor layer 13 can be prevented from being damaged.

EXAMPLES

Hereinafter, the present invention will be described more specifically by way of example.

Example 1

Example 1 is an example of forming Cu(In, Ga)Se$_2$ layer (CIGS layer) and forming a CdS layer on the CIGS layer by a chemical bath deposition process.

First, a Mo layer was formed on a glass substrate by sputtering, and a Cu(In, Ga)Se$_2$ layer (a thickness of 2 $\mu$m) was formed thereon by vapor deposition.

Next, a CdS layer was formed thereon by a chemical bath deposition process. More specifically, first, a solution containing cadmium acetate (Cd(CH$_3$COO)$_2$), thiourea (NH$_2$CSNH$_2$), ammonium acetate (CH$_3$COONH$_4$) and ammonia was prepared. The concentration of the cadmium acetate in the solution was 0.001M, the concentration of the thiourea was 0.005M, the concentration of the ammonium acetate was 0.01M and the concentration of the ammonia was 0.4M. The container containing this solution was put in a hot water bath kept at 85° C. The substrate was put in this solution to form a CdS layer on the substrate. An eight minute treatment provided a CdS layer having a thickness of 10 nm.

Example 2

Example 2 is an example of forming a Cu(In, Ga)Se$_2$ layer (CIGS layer) and forming a Zn(O, S) layer on the CIGS layer by a chemical bath deposition process.

First, a Mo layer and a Cu(In, Ga)Se$_2$ layer (a thickness of 2 $\mu$m) were formed on a glass substrate in the same manner as in Example 1.

Next, a Zn(O, S) layer was formed thereon by a chemical bath deposition process. More specifically, first, a solution containing zinc acetate (Zn(CH$_3$COO)$_2$), thiourea (NH$_2$CSNH$_2$) and ammonia was prepared. The concentration of the zinc acetate in the solution was 0.025M, the concentration of the thiourea was 0.375M, and the concentration of the ammonia was 2.5M. The container containing this solution was put in a hot water bath kept at 85° C. The substrate was put in this solution to form a Zn(O, S) layer on the substrate. An eight minute treatment provided a Zn(O, S) layer having a thickness of 10 nm.

Example 3

Example 3 is an example of forming a Cu(In, Ga)Se$_2$ layer (CIGS layer) and forming a ZnIn$_2$Se$_4$ layer on the CIGS layer by vapor deposition.

First, a Mo layer was formed on a soda-lime glass by sputtering. Then, cells containing Cu, In, Ga and Se were heated so that a Cu(In, Ga)Se$_2$ layer was deposited on the Mo layer. During this process, the temperature of each cell was changed to change the amount of each substance evaporated so that the composition of the Cu(In, Ga)Se$_2$ layer was controlled.

Subsequently, crucibles containing Zn, In and Se were heated while the temperature of each crucible was changed, so that a $ZnIn_2Se_4$ layer was formed. The formation duration was one minute. The composition of the formed layer was examined by photoelectron spectrometry. The results were that Zn:In:Se=1:2:4. When the cross-section of the formed layer was observed through a transmission electron microscope, the thickness was turned out to be about 10 nm.

In this example, a method for forming the $ZnIn_2Se_4$ layer has been described, but it also was possible to form an $In_2Se_3$ layer and a ZnSe layer in the same manner.

Example 4

Example 4 is an example of producing a solar cell of the present invention.

First, a Mo layer was formed on a glass substrate by sputtering, and a $Cu(In, Ga)Se_2$ layer (a thickness of 2 μm) was formed thereon by vapor deposition.

Next, the third semiconductor layer 19 described in the embodiment was formed on the surface of the $Cu(In, Ga)Se_2$ layer (corresponding to the first semiconductor layer 13). More specifically, first, a solution containing indium chloride ($InCl_3$), which is a compound (salt) containing In, and thioacetamide ($CH_3CSNH_2$) was prepared. The concentration of the indium chloride in the solution was 0.005M and the concentration of the thioacetamide was 0.1M, and pH was 1.9. The container containing this solution was put in a hot water bath kept at 75° C. The substrate provided with the $Cu(In, Ga)Se_2$ layer was immersed in this solution for about 10 seconds. Thereafter, the substrate was removed from the solution and washed with pure water. Thus, a $Cu(In, Ga)(Se, S)_2$ layer was formed on the $Cu(In, Ga)Se_2$ layer.

Then, a CdS layer was formed on the CIGS layer by the method described in Example 1.

Furthermore, a $Zn_{0.9}Mg_{0.1}O$ layer (thickness of 100 nm) was formed on the CdS layer by sputtering with two targets of a ZnO target and a MgO target. Sputtering was performed at an argon gas pressure of 2.66 Pa ($2\times10^{-2}$ Torr), a high frequency power applied to the ZnO target of 200 W and a high frequency power applied to the MgO target of 100W.

Figure 5:
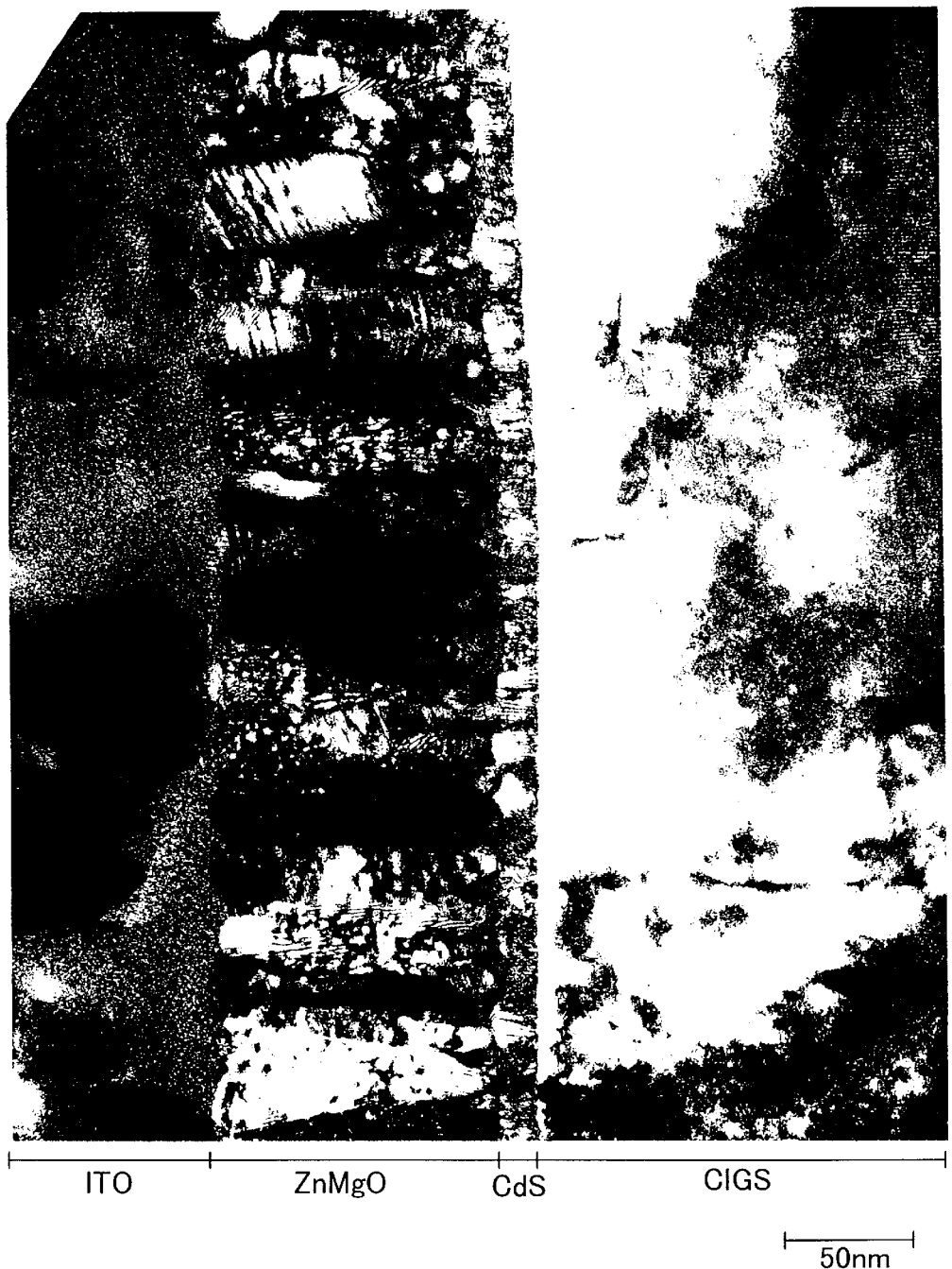
FIG. 5 is an example of a cross-sectional view of the solar cell of the present invention obtained from a transmission electron microscope.

Furthermore, ITO (thickness of 100 nm) as a transparent conductive film was formed by sputtering. More specifically, the film was formed at an argon gas pressure of 1.064 Pa ($8\times10^{-3}$ Torr), a high frequency power of 400W. Thereafter, interconnection electrodes were formed by laminating a NiCr layer and an Au layer by electron beam evaporation. FIG. 5 shows the cross-sectional view of the thus produced solar cell obtained from a transmission electron microscope. As shown in FIG. 5, the structure in which the CIGS layer, the CdS layer and the ZnMgO layer were laminated was formed.

The solar cell characteristics were measured by irradiating the thus produced solar cell with a pseudo solar light of AM (air mass) of 1.5 at 100 m $W/cm^2$. The results were as follows. For the solar cell in which a thin CdS layer (corresponding to the layer 14) was formed between the CIGS layer (corresponding to the first semiconductor layer 13) and the $Zn_{1-x}Mg_xO$ layer (corresponding to the second semiconductor layer 15), the short-circuit current was 32.5 $mA/cm^2$, the open-circuit voltage was 0.65 V, the fill factor was 0.76, and the conversion efficiency was 16.1%.

On the other hand, as a comparative example, a solar cell not including the CdS layer was produced and the characteristics were measured. For this solar cell as a comparative example, the short-circuit current was 35.3 $mA/cm^2$, the open-circuit voltage was 0.56 V, the fill factor was 0.57, and the conversion efficiency was 11.1%.

In the solar cell of Example 4, a thin CdS layer was used so that a junction with less defects was formed, and thus a solar cell having superior characteristics was produced successfully.

Example 5

Example 5 is another example of producing the solar cell of the present invention.

First, a Mo layer was formed on a glass substrate by sputtering, and a $Cu(In, Ga)Se_2$ layer (a thickness of 2 μm) was formed thereon by vapor deposition.

Next, a solution containing indium chloride ($InCl_3$), which is a compound (salt) containing In, and thioacetamide was prepared. The concentration of the indium chloride in the solution was 0.005M and the concentration of the thioacetamide was 0.1M, and pH was 1.9. The container containing this solution was put in a hot water bath kept at 75° C. The substrate provided with the $Cu(In, Ga)Se_2$ layer was immersed in this solution for about 10 seconds. Thereafter, the substrate was removed from the solution and washed with pure water. Thus, a $Cu(In, Ga)(Se, S)_2$ layer was formed on the $Cu(In, Ga)Se_2$ layer in the same manner as in Example 4.

Then, a solution containing cadmium sulfate ($CdSO_4$), which is a compound (salt) containing cadmium, and ammonia was prepared. The concentration of the cadmium sulfate in the solution was 0.001M and the concentration of the ammonia was 1M. The container containing this solution was put in a hot water bath kept at 85° C. The CIGS layer was immersed in this solution for six minutes. Thereafter, the substrate was removed from the solution and washed with pure water. Thus, Cd was added on the surface of the CIGS layer.

Next, a Zn(O, S) layer was formed on the CIGS layer by a chemical bath deposition process described in Example 2.

Furthermore, a $Zn_{1-x}Mg_xO$ layer (thickness of 100 nm) was formed on the Zn(O, S) layer by sputtering with two targets of a ZnO target and a MgO target. Sputtering was performed at an argon gas pressure of 2.66 Pa ($2\times10^{-2}$ Torr), a high frequency power applied to the ZnO target of 200W and a high frequency power applied to the MgO target of 100W.

Furthermore, ITO (thickness of 100 nm) as a transparent conductive film was formed by sputtering. More specifically, the film was formed at an argon gas pressure of 1.064 Pa ($8\times10^{-3}$ Torr), a high frequency power of 400W. Thereafter, interconnection electrodes were formed by laminating a NiCr layer and an Au layer by electron beam evaporation.

The solar cell characteristics were measured by irradiating the thus produced solar cell with a pseudo solar light of AM (air mass) of 1.5 at 100 m $W/cm^2$. The results were as follows. For the solar cell in which a thin Zn(O, S) layer (corresponding to the layer 14) was formed between the CIGS layer (corresponding to the first semiconductor layer 13) and the $Zn_{1-x}Mg_xO$ layer (corresponding to the second semiconductor layer 15), the short-circuit current was 33.3 $mA/cm^2$, the open-circuit voltage was 0.55 V, the fill factor was 0.71, and the conversion efficiency was 13.0%.

On the other hand, as a comparative example, a solar cell not including the Zn(O, S) layer was produced and the characteristics were measured. For this solar cell as a comparative example, the short-circuit current was 29.5 $mA/cm^2$, the open-circuit voltage was 0.47 V, the fill factor was 0.60, and the conversion efficiency was 8.3%.

In the solar cell of Example 5, a thin Zn(O, S) layer was used so that a junction with less defects was formed, and thus a solar cell having high characteristics was produced successfully.

In this example, the Zn(O, S) layer was used as the layer 14, but the same effect was obtained when a $ZnIn_2Se_4$ layer, an $In_2Se_3$ layer or a ZnSe layer, which are described in Example 3, were used.

The invention may be embodied in other forms without departing from the spirit or essential characteristics thereof.

The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solar cell comprising a first semiconductor layer that is p-type, and a second semiconductor layer that is n-type formed over the first semiconductor layer, the solar cell comprising a layer A between the first semiconductor layer and the second semiconductor layer, the layer A being made of an insulator or a semiconductor different from the first semiconductor layer and the second semiconductor layer, wherein a band gap $Eg_1$ of the first semiconductor layer and a band gap $Eg_2$ of the second semiconductor layer satisfy the relationship $Eg_1 < Eg_2$, an electron affinity $\chi_1$ (eV) of the first semiconductor layer and an electron affinity $\chi_2$ (eV) of the second semiconductor layer satisfy the relationship $0 \leq (\chi_1 - \chi_2) < 0.5$, an average layer thickness of the layer A is 1 nm or more and 20 nm or less, and the layer A comprises Cd and S as main components.

2. The solar cell according to claim 1, wherein the second semiconductor layer is formed by sputtering.

3. The solar cell according to claim 1, wherein the second semiconductor layer is formed of an oxide containing Zn and Mg.

4. The solar cell according to claim 3, wherein the oxide is represented by a general formula $Zn_{1-X}Mg_XO$, where $0<X<0.5$.

5. The solar cell according to claim 1, wherein the layer A is formed by using a solution containing a salt of Cd and a sulfur-containing compound.

6. The solar cell according to claim 1, wherein the first semiconductor layer comprises at least one element from each of groups Ib, IIIb and VIb.

7. The solar cell according to claim 6, wherein the element from group Ib is Cu, the element from group IIIb is at least one element selected from In and Ga, and the element from group VIb is at least one element selected from Se and S.

8. The solar cell according to claim 6, further comprising a third semiconductor layer disposed between the first semiconductor layer and the layer A, wherein the third semiconductor layer comprises an element from group Ib, an element from group IIIb and sulfur, and an atomic ratio of sulfur in the third semiconductor layer is higher than that in the first semiconductor layer.

9. The solar cell according to claim 6, the first semiconductor layer comprises at least one element selected from Cd and Zn on a surface thereof on a side of the layer A.

10. A solar cell comprising a first semiconductor layer that is p-type, and a second semiconductor layer that is n-type formed over the first semiconductor layer, the solar cell comprising a layer A between the first semiconductor layer and the second semiconductor layer, the layer A being made of an insulator or a semiconductor different from the first semiconductor layer and the second semiconductor layer, wherein a band gap $Eg_1$ of the first semiconductor layer and a band gap $Eg_2$ of the second semiconductor layer satisfy the relationship $Eg_1 < Eg_2$, an electron affinity $\chi_1$ (eV) of the first semiconductor layer and an electron affinity $\chi_2$ (eV) of the second semiconductor layer satisfy the relationship $0 \leq (\chi_1 - \chi_2) < 0.5$, an average layer thickness of the layer A is 1 nm or more and 20 nm or less, and the layer A comprises Zn, O and S as main components.

11. The solar cell according to claim 10, wherein the layer A is formed from a solution containing a salt of Zn and a sulfur-containing compound.

12. The solar cell according to claim 10, wherein the first semiconductor layer comprises at least one element from each of groups Ib, IIIb and VIb.

13. The solar cell according to claim 12, wherein the element from group Ib is Cu, the element from group IIIb is at least one element selected from In and Ga, and the element from group VIb is at least one element selected from Se and S.

14. The solar cell according to claim 12, further comprising a third semiconductor layer disposed between the first semiconductor layer and the layer A, wherein the third semiconductor layer comprises an element from group Ib, an element from group IIIb and sulfur, and an atomic ratio of sulfur in the third semiconductor layer is higher than that in the first semiconductor layer.

15. The solar cell according to claim 12, the first semiconductor layer comprises at least one element selected from Cd and Zn on a surface thereof on a side of the layer A.

16. A solar cell comprising a first semiconductor layer that is p-type, and a second semiconductor layer that is n-type formed over the first semiconductor layer, the solar cell comprising a layer A between the first semiconductor layer and the second semiconductor layer, the layer A being made of an insulator or a semiconductor different from the first semiconductor layer and the second semiconductor layer, wherein a band gap $Eg_1$ of the first semiconductor layer and a band gap $Eg_2$ of the second semiconductor layer satisfy the relationship $Eg_1 < Eg_2$, an electron affinity $\chi_1$ (eV) of the first semiconductor layer and an electron affinity $\chi_2$ (eV) of the second semiconductor layer satisfy the relationship $0 \leq (\chi_1 - \chi_2) < 0.5$, an average layer thickness of the layer A is 1 nm or more and 20 nm or less, and the layer A is formed of a compound containing Se and at least one element selected from Zn and In.

17. The solar cell according to claim 16, wherein the first semiconductor layer comprises at least one element from each of groups Ib, IIIb and VIb.

18. The solar cell according to claim 17, wherein the element from group Ib is Cu, the element from group IIIb is at least one element selected from In and Ga, and the element from group VIb is at least one element selected from Se and S.

19. The solar cell according to claim 17, further comprising a third semiconductor layer disposed between the first semiconductor layer and the layer A, wherein the third semiconductor layer comprises an element from group Ib, an element from group IIIb and sulfur, and an atomic ratio of sulfur in the third semiconductor layer is higher than that in the first semiconductor layer.

20. The solar cell according to claim 17, the first semiconductor layer comprises at least one element selected from Cd and Zn on a surface thereof on a side of the layer A.

* * * * *